US008885990B2

United States Patent
Kawai (10) Patent No.: US 8,885,990 B2
(45) Date of Patent: Nov. 11, 2014

(54) OPTICAL COMMUNICATION MODULE

(75) Inventor: Hiroki Kawai, Yokosuka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 13/809,709

(22) PCT Filed: Jul. 14, 2011

(86) PCT No.: PCT/JP2011/066101
§ 371 (c)(1),
(2), (4) Date: Jan. 11, 2013

(87) PCT Pub. No.: WO2012/008530
PCT Pub. Date: Jan. 19, 2012

(65) Prior Publication Data
US 2013/0114925 A1    May 9, 2013

(30) Foreign Application Priority Data
Jul. 15, 2010 (JP) ................................. 2010-160211

(51) Int. Cl.
*G02B 6/12* (2006.01)
*G02B 6/42* (2006.01)
*H01S 5/022* (2006.01)

(52) U.S. Cl.
CPC *G02B 6/12* (2013.01); *G02B 6/421* (2013.01); *G02B 6/4292* (2013.01); *G02B 6/428* (2013.01); *G02B 6/4249* (2013.01); *H01S 5/02284* (2013.01); *G02B 6/4267* (2013.01)
USPC .................. 385/14; 385/88; 385/89; 385/90; 385/91; 385/92; 385/93; 385/94

(58) Field of Classification Search
USPC ................................................ 385/14, 88–91
See application file for complete search history.

(56) References Cited

U.S. PATENT DOCUMENTS 5,963,693 A    10/1999    Mizue et al.
6,403,948 B1    6/2002    Tachigori
(Continued)

FOREIGN PATENT DOCUMENTS

EP        0 826 997 B1    7/2003
JP        2000-196112 A    7/2000
(Continued)

OTHER PUBLICATIONS

International Search Report for PCT/JP2011/066101 dated Sep. 6, 2011 [PCT/ISA/210].
(Continued)

*Primary Examiner* — Ryan Lepisto
*Assistant Examiner* — Guy Anderson
(74) *Attorney, Agent, or Firm* — Sughrue Mion, PLLC (57) ABSTRACT

Provided is a compact optical communication module which is configured and structured so as to be suitable for high-speed transmission and which facilitates the fixing and positioning of optical elements and prevents misalignment of the optical axis during temperature change. An optical communication module is constituted so as to have a transceiver circuit as the circuit substrate, a submount unit, a fiber stub as an optical connector member, and an optical fiber coupling member. The optical communication module is configured as a modular component in which the optical axis of an optical element mounted on the submount unit is roughly parallel to the mounting surface of the transceiver circuit.

2 Claims, 6 Drawing Sheets

(56) References Cited

U.S. PATENT DOCUMENTS

| | | |
|---|---|---|
| 2003/0099444 A1 | 5/2003 | Kim et al. |
| 2005/0205771 A1 | 9/2005 | Sherrer et al. |
| 2005/0218317 A1 | 10/2005 | Sherrer et al. |
| 2006/0006313 A1 | 1/2006 | Sherrer et al. |
| 2006/0006320 A1 | 1/2006 | Sherrer et al. |
| 2006/0006321 A1 | 1/2006 | Sherrer et al. |
| 2008/0145060 A1* | 6/2008 | Nelson et al. ............ 398/135 |
| 2008/0277571 A1 | 11/2008 | Sherrer et al. |
| 2010/0142882 A1* | 6/2010 | Heinemann et al. ........ 385/14 |
| 2011/0062455 A1 | 3/2011 | Sherrer et al. |
| 2012/0061693 A1 | 3/2012 | Sherrer et al. |

FOREIGN PATENT DOCUMENTS

| | | | |
|---|---|---|---|
| JP | 2001-15773 | A | 1/2001 |
| JP | 2003-347561 | A | 12/2003 |
| JP | 2009-088405 | A | 4/2009 |
| JP | 2010-96810 | A | 4/2010 |

OTHER PUBLICATIONS

Written Opinion for PCT/JP2011/066101 dated Sep. 6, 2011 [PCT/ISA/237].

Office Action dated Oct. 25, 2013 issued by the Japanese Patent Office in counterpart Japanese Patent Application No. 2010-160211.

Office Action dated Jan. 28, 2014 issued by the Japanese Patent Office in counterpart Japanese Patent Application No. 2010-160211.

Communication dated Jun. 18, 2014 issued by the European Patent Office in counterpart European Patent Application No. 11806860.0.

* cited by examiner

OPTICAL COMMUNICATION MODULE

TECHNICAL FIELD

The present invention relates to an optical communication module.

BACKGROUND ART

An optical communication module disclosed in Patent Document 1 includes a case, an optical device, and a circuit substrate. The case is fixedly set on a convex-shaped boss that protrudes from the circuit substrate. That is, the case is fixed in a floating state from the circuit substrate. The case is provided with an optical fiber insertion portion into which an optical fiber is inserted, and an optical device insertion portion into which the optical device is inserted. If the optical fiber is inserted into the optical fiber insertion portion, a core portion protrudes to the optical device insertion portion, and thus the core portion and the optical device are directly optical-coupled to each other. The optical device insertion portion is formed in such a way that a bottom surface of the case opposite to the circuit substrate is opened.

The optical device includes an optical element, a light permeable portion, and a lead frame. The optical element is mounted on one end of the lead frame. Surroundings of the mounted portion are covered by the light permeable portion. The light permeable portion has a tapered portion which is formed in front of the optical element, and a front end of the core portion of the optical fiber is guided toward the optical element by the tapered portion. The lead frame is formed so that a middle portion extends from one end side, on which the optical element is mounted, in a direction perpendicular to the circuit substrate. The other end side from the middle portion of the lead frame is curved to have a curved portion. The other end of the lead frame is formed in parallel with the circuit substrate, and is connected to the circuit substrate by the parallel portion. The lead frame has a curved portion at the portion in which the case is floated over the circuit substrate. The lead frame is flexible.

CITATION LIST

Patent Document

Patent Document 1: Japanese Unexamined Patent Application Publication No. 2009-88405

SUMMARY OF INVENTION

Technical Problem

In the related art, since the case is floated over the circuit substrate and the lead frame is provided with the curved portion and is connected to the circuit substrate in the curved state, the whole length of the lead frame is extended, and thus it is said that it is not a transmission path suitable for high-speed transmission (as the transmission path is shorter, it is more effective in the high-speed transmission).

In the related art, a space is needed by the arrangement such as floated case, but since the space is taken by forming the curved portion on the lead frame, it is said that there is a limit on the miniaturization of the optical communication module.

Also, in the related art, since the lead frame is flexible, it may be difficult to fix or position the optical element. Furthermore, since the lead frame is exposed, it is easily influenced by the heat. Therefore, naturally, a degree of thermal expansion/shrinkage is high, and misalignment of an optical axis may occur.

The present invention has been made in view of the above-described problems, and an object of the present invention is to provide an optical communication module which is configured and structured so as to be suitable for high-speed transmission and which facilitates fixing and positioning of optical elements and prevents misalignment of an optical axis during temperature change.

Solution to Problem

In order to solve the above problems, an optical communication module of the first invention is characterized by including a circuit substrate, and a submount unit having a substantially block shape configured to be mounted on a mounting surface of the circuit substrate, wherein the submount unit includes a connection surface mounted on the mounting surface, a surface mounting connection which is provided on the connection surface and comes in contact with a substrate-side connection of the mounting surface, an optical element mounting surface which is a surface in a direction substantially perpendicular to the connection surface, an optical element which is mounted on the optical element mounting surface, of which an optical axis is in substantially parallel with the mounting surface, and a transmission path which is wired over the connection surface and the optical element mounting surface to connect the optical element and the surface mounting connection.

The optical communication module of the second invention is characterized by further including an optical connection member configured to be interposed between the optical element of the optical element mounting surface and an optical fiber corresponding to the optical element.

The optical communication module of the third invention is characterized in that a convex portion protrudes from the optical element mounting surface to abut against the optical connection member.

The optical communication module of the fourth invention is characterized by further including an optical axis aligning unit for aligning optical axes of the optical element and the optical fiber.

Effects of Invention

According to the first invention, the submount unit having the substantially block shape is mounted on the mounting surface of the circuit substrate to form the optical communication module, and the submount unit has the construction to shorten the transmission path extending from the optical element which is mounted on the optical element mounting surface, as compared to the related art. Accordingly, the optical communication module including the configuration and structure suitable for the high-speed transmission can be effectively provided. In addition, according to the optical communication module of the present invention, the submount unit is mounted on the mounting surface of the circuit substrate, without being floated, it does need the space, like the related art. As a result, the compact optical communication module can be provided. In addition, According to the present invention, since the submount unit is formed in the substantially block shape, and the transmission path is provided to extend over the optical element mounting surface and the connection surface of the submount unit of such a shape, it is not necessary for the submount unit to have the flexibility, like the lead frame of the related art. As a result, the fixing or positioning of the optical element can be effectively carried out. Moreover, according to the optical communication module of the present invention, since the submount unit is formed in the substantially block shape, the submount unit is made of the material having low thermal expansion/shrinkage. As a result, it is possible to effectively suppress the misalignment of the optical axis during temperature change.

According to the second invention, since the optical communication module includes the optical connection member, the optical element can be effectively connected to the optical fiber.

According to the third invention, since the optical connection member abuts against the convex portion protruding from the optical element mounting surface, the positioning can be easily performed. Also, according to the present invention, since the optical element is covered by abutment of the optical connection member, the optical element can be effectively protected According to the fourth invention, since the optical communication module includes the optical axis aligning unit, it is possible to easily align the optical axes of the optical element and the optical fiber, thereby suppressing the misalignment of the optical axis.

DESCRIPTION OF EMBODIMENTS

Figure 1:
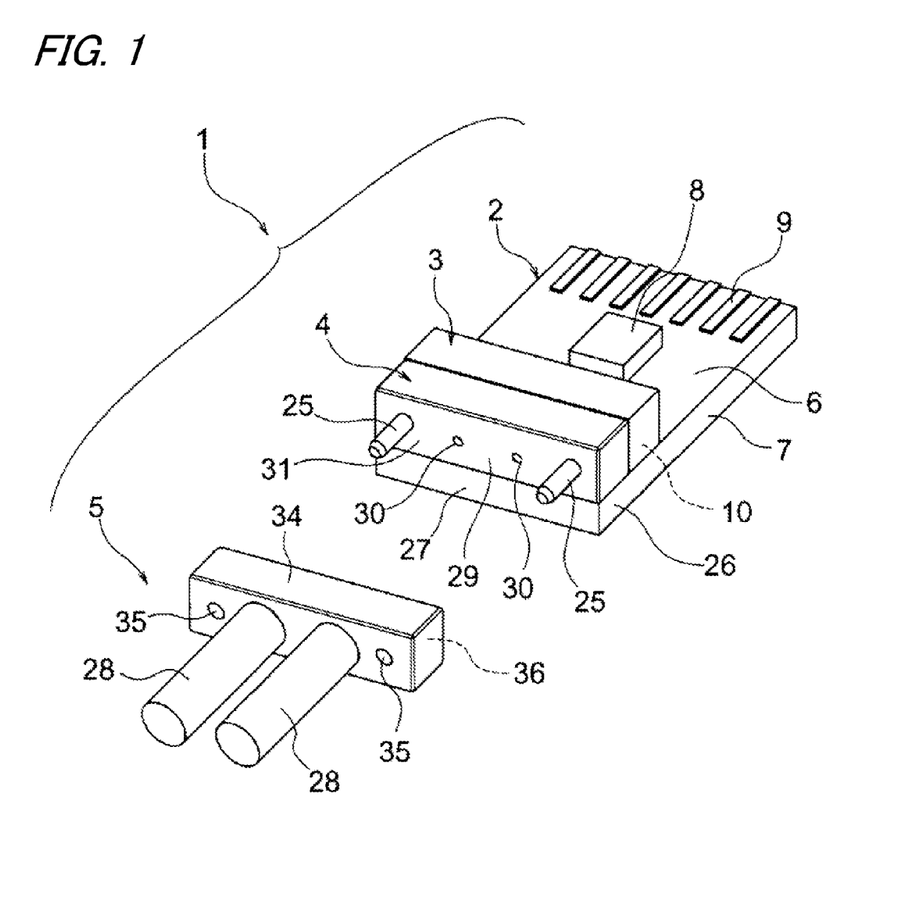
FIG. 1 is a perspective view illustrating a configuration of an optical communication module according to the present invention.
Figure 2A:
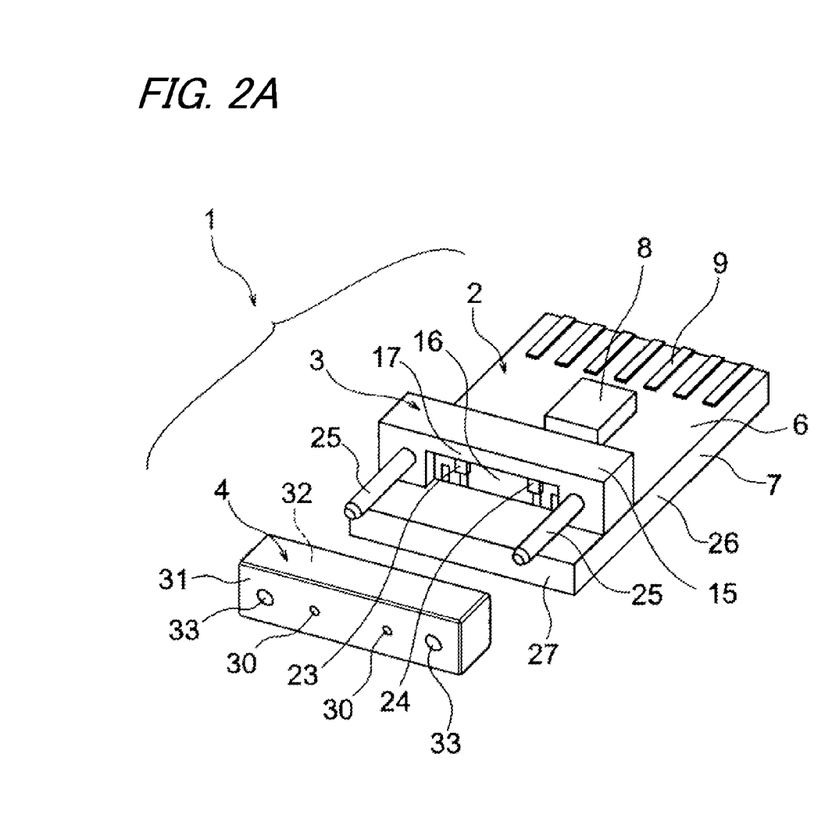
FIG. 2A is an exploded perspective view of a submount unit and a fiber stub in the optical communication module.
Figure 2B:
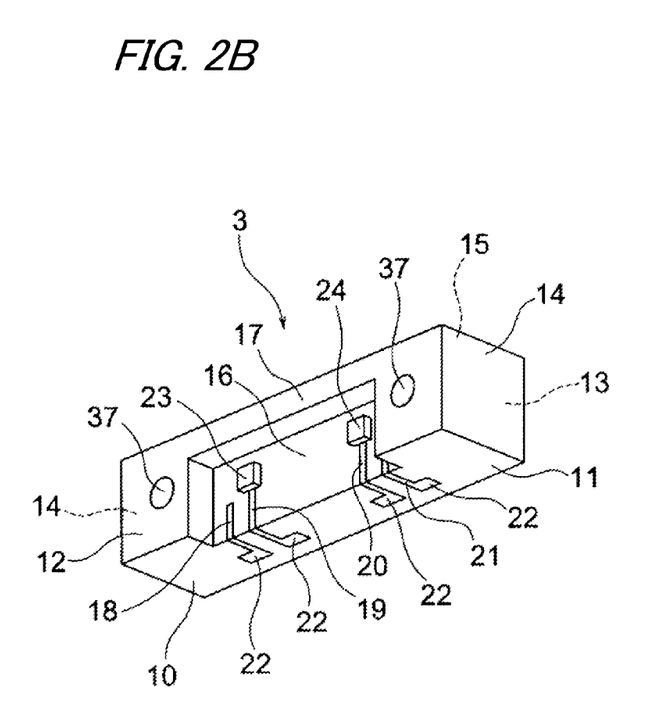
FIG. 2B is an enlarged perspective view of the submount unit.

Embodiments of the present invention will now be described with reference to the accompanying drawings. FIG. 1 is a perspective view illustrating a configuration of an optical communication module according to the present invention. FIG. 2A is an exploded perspective view of a submount unit and a fiber stub in the optical communication module, and FIG. 2B is an enlarged perspective view of the submount unit.

In FIG. 1, reference numeral 1 denotes the optical communication module of the present invention. The optical communication module 1 includes a transceiver circuit 2 (circuit substrate), a submount unit 3, a fiber stub 4 (optical connection member), and an optical fiber coupling member 5. The optical communication module 1 is configured as a module product of an optical axis of an optical element (will be described later) of the submount unit 3 is substantially in parallel with a mounting surface 6 (will be described later) of the transceiver circuit 2. First, each configuration described above will be described.

The transceiver circuit 2 includes a substrate body 7 formed in a shape of, for example, a rectangular flat plate, and a surface of substrate body 7 serves as the mounting surface 6. The shape of the illustrated transceiver circuit 2 is one example. The substrate body 7 is a glass epoxy substrate, a ceramic substrate, or the like, and the mounting surface 6 is formed thereon with a circuit (not illustrated) forming a desired pattern, and a substrate-side connection (not illustrated) contiguous with the circuit. The substrate-side connection (not illustrated) is a portion which is electrically connected to the submount unit 3. The substrate-side connection is formed in a shape to be an electrode pad. Also, the substrate-side connection is disposed and shaped in line with a position connected with the submount unit 3.

An electronic component 8 is mounted on the circuit (not illustrated) of the mounting surface 6. The electronic component 8 is an electronic component for a transmitter or a receiver. One example of the transmitter is a laser driving IC or the like. Also, one example of the receiver is a receiving amplifier IC or the like.

Reference number 9 in the substrate body 7 denotes a card edge portion. The substrate body 7 of this shape is formed in a shape of a card edge connector. The shape of the substrate body 7 illustrated herein is one example. Other examples will be described later with reference to FIGS. 5 and 6.

In FIGS. 1 and 2, the submount unit 3 is formed in a block shape of a substantially rectangular parallelepiped in this embodiment. The submount unit 3 of this shape is mounted in a state in which a connection surface 10 formed on the submount unit 3 is mounted on the mounting surface 6 of the substrate body 7 in the transceiver circuit 2, in other words, the connection surface 10 is in surface contact with the mounting surface 6.

The submount unit 3 has a bottom surface 11 which is formed as the connection surface 10. The submount unit 3 has front surface 12 which is continuous with the bottom surface 11 (connection surface 10) and is a surface perpendicular to the bottom surface 11, a rear surface 13 (the rear surface 13 opposite to the front surface 12 is drawn by a dotted line, since it is at a position which is hided from an angle viewing the submount unit 3), and left and right lateral surfaces 14 and 14 (one of the lateral surfaces 14 is drawn by a dotted line, since it is at a position which is hided from an angle viewing the submount unit 3). Also, the submount unit 3 has a top surface 15 which is a surface in parallel with the bottom surface 11 (connection surface 10) (the top surface 15 is drawn by a dotted line, since it is at a position which is hided from an angle viewing the submount unit 3).

The front surface 12 is provided with an optical element mounting surface 16 which is formed in concave shape. The optical element mounting surface 16 is formed to be in parallel with the front surface 12, and be a surface continuous with the bottom surface 11 (connection surface 10) and perpendicular to the bottom surface. Since the front surface 12 is formed to protrude from the optical element mounting surface 16, the front surface 12 is formed as a convex portion 17.

Of the convex portion 17, a portion directly above the optical element mounting surface 16 is formed in a substantial brim shape. The convex portion 17 is formed in a shape to surround the optical element mounting surface 16 in a gate form. The protruding length (in other words, a concave depth of the front surface 12) of the convex portion 17 is set as a length so that an interval between the fiber stub 4 and a light emitting element 23 or a light receiving element 24, which will be described later, is optimized.

The convex portion 17 is formed to abut against the fiber stub 4. The convex portion 17 abuts against the fiber stub 4, thereby suppressing the misalignment of the interval and thus stabilizing an optical coupling efficiency.

The connection surface 10 and the optical element mounting surface 16 are provided with transmission paths 18, 19, 20 and 21 as wiring extending over two surfaces. The transmission paths 18, 19, 20 and 21 are provided by a given electrode pattern so that the transmission paths 18 and 19 are provided as a transmission side, while the transmission paths 20 and 21 are provided as a receiving side. The transmission paths 18, 19, 20 and 21 are formed as the electrode pattern of a short length extending over two surfaces. Also, the transmission paths 18, 19, 20 and 21 are optimized by a shape suitable for high-speed transmission.

Ends of the transmission paths 18, 19, 20 and 21 at the side of the connection surface 10 are provided with each surface mounting connection 22 in a row. The surface mounting connection 22 is formed as a surface mounting electrode pad. Each surface mounting connection 22 is disposed and formed in line with a position of the substrate-side connection (not illustrated) of the transceiver circuit 2.

The ends of the transmission paths 19 and 20 at the side of the optical element mounting surface 16 are respectively mounted with the light emitting element 23 (optical element) and the light receiving element 24 (optical element). That is, the light emitting element 23 and the light receiving element 24 are mounted on the optical element mounting surface 16. The light emitting element 23 and the light receiving element 24 are mounted so that its optical axis is in a direction perpendicular to the optical element mounting surface 16 and also in parallel with the mounting surface 6 of the transceiver circuit 2. The light emitting element 23 and the light receiving element 24 are mounted in line with the positions of optical fibers 28 and 28, which will be described later, at a predetermined distance in a left and right direction.

One example of the light emitting element 23 is VCSEL (Vertical Cavity Surface Emitting laser). Also, one example of the light receiving element 24 is a photodiode (Si-based, GaAs-based, and InGaAs-based).

Guide pins 25 and 25 respectively protrude from both left and right sides of the front surface 12 in a direction perpendicular to the front surface 12. The guide pins 25 and 25 are formed in a shape of a circular rod, for example, as illustrated in the drawing, and have a length similar to the thickness of the fiber stub 4 and the optical fiber coupling member 5. The guide pins 25 and 25 are disposed at positions of the same height at a predetermined interval in the left and right direction.

The guide pins 25 and 25 are provided as portions constituting an optical axis aligning means. As the guide pins 25 and 25 are provided, misalignment of the optical axis can be suppressed. The guide pins 25 and 25 of this type are provided by punching holes 37 in the front surface 37 and then inserting and fixing these pins to the holes 37.

The submount unit 3 has a body portion made of ceramics (alumina, aluminum nitride, LTCC (Low Temperature Co-fired Ceramics, or the like), or high-temperature resin (epoxy, LCP (Liquid Crystal Polymer), or the like). Since the body portion of the submount unit 3 is made of the above material, it is possible to suppress the misalignment of the optical axis due to thermal expansion/shrinkage during temperature change.

Herein, a mounting example of the submount unit 3 will be described. It is not specifically limited, but, for example, the submount unit 3 is mounted so that left and right sides 14 and 14 are flush with the left and right lateral ends 26 of the substrate body 7. Also, the submount unit 3 is mounted to position in rear of a front end 27 of the substrate body 7 by the thickness of the fiber stub 4.

The fiber stub 4 is a member which is interposed between the light emitting element 23 and the light receiving element 24 which are mounted on the optical element mounting surface 16, and the optical fibers 28 and 28 of the optical fiber coupling member 5 corresponding to the light emitting element 23 and the light receiving element 24 to optically couple the light emitting element 23, the light receiving element 24, and the optical fibers 28 and 28. Similar to the submount unit 3, the fiber stub 4 is formed in a block shape of a substantially rectangular parallelepiped. The fiber stub 4 of this shape has a stub body 29 and optical fibers 30 and 30 of short length which are embedded in the stub body 29.

It is not specifically limited, but the optical fibers 30 and 30 of short length employ the same one as the optical fibers 28 and 28 corresponding to the substrate-side connection light emitting element 23 and the light receiving element 24. The optical fibers 30 and 30 of the short length are embedded to be straight from the front surface 31 of the stub body 29 to the rear surface 32. Guide pin holes 33 and 33 penetrate through left and right outer side rather than the optical fibers 30 and 30 of the short length.

The guide pins 25 and 25 of the submount unit 3 are inserted into the guide pin holes 33 and 33. The guide pin holes 33 and 33 are provided as a part constituting an optical axis aligning means. As the guide pin holes 33 and 33 are provided, it is possible to suppress the misalignment of the optical axis. The optical fibers 30 and 30 of the short length are configured to be positioned on the basis of the guide pin holes 33 and 33.

The rear surface 32 of the stub body 29 is formed as a part to abut against the convex portion 17 of the submount unit 3 (the rear surface 32 is drawn by a dotted line, since it is at a position which is hided from an angle viewing the submount unit). When the rear surface 32 abuts against the convex portion 17, the light emitting element 23 and the light receiving element 24 are covered by the rear surface 32, and thus are protected from the exterior.

Since the light receiving element 24 for the high-speed transmission has a decreased light receiving diameter (light receiving area), it can be said that approaching of the rear surface 32 of the stub body 29 to the light emitting element 23 and the light receiving element 24 is effective in improvement of the optical coupling efficiency.

The front surface 31 of the stub body 29 is a portion which abuts against the optical fiber coupling member 5.

The stub body 29 of the fiber stub 4 is made of ceramics (alumina, aluminum nitride, LTCC (Low Temperature Co-fired Ceramics, or the like), or high-temperature resin (epoxy, LCP (Liquid Crystal Polymer, or the like), similar to the submount unit. Since the stub body 29 of the fiber stub 4 is made of the above material, it is possible to suppress the misalignment of the optical axis due to thermal expansion/shrinkage during temperature change.

The optical fiber coupling member 5 includes the optical fibers 28 and 28, and a coupling member body 34 which receives and holds each front end of the optical fibers 28 and 28 and couples the front end to the optical connection member (herein, fiber stub 4). The coupling member body 34 has a function of ferrule, and is formed in a block shape of a substantially rectangular parallelepiped, similar to the submount unit 3 or the fiber stub 4.

Guide pin holes 35 and 35 penetrate through the coupling member body 34. The guide pin holes 35 and 35 are disposed and formed in line with the positions of the guide pin holes 33 and 33 of the fiber stub 4. The guide pins 25 and 25 of the submount unit 3 are inserted into the guide pin holes 35 and 35, similar to the fiber stub 4.

The guide pin holes 35 and 35 are provided as a part constituting an optical axis aligning means. As the guide pin holes 35 and 35 are provided, it is possible to suppress the misalignment of the optical axis. The optical fibers 28 and 28 are configured to be positioned on the basis of the guide pin holes 35 and 35.

One example of the optical fibers 28 and 28 is a PCS (Polymer Clad Silica) fiber (core diameter is ϕ200 μm and clad diameter is ϕ230 μm), or an optical glass fiber having a core diameter of ϕ50 μm.

Next, the mounting of the optical communication module 1 will be described in brief on the basis of the above-described configuration and structure. The optical communication module 1 is configured to be mounted from a first process to a third process in order.

In the first process, the electronic component 8 and the submount unit 3 are mounted on the mounting surface 6 of the substrate body 7. In this instance, the submount unit 3 is mounted on the mounting surface 6, without being floated. That is, the submount unit 3 is mounted in the same state as that the connection surface 10 comes in surface contact with the mounting surface 6.

In the second process, the fiber stub 4 is mounted on the submount unit 3 by inserting the guide pins 25 and 25 of the submount unit 3 into the guide pin holes 33 and 33. In this instance, the fiber stub 4 is slid, with the rear surface 32 of the fiber stub 4 abutting against the convex portion 17 of the submount unit 3. Since the fiber stub 4 is guided by the guide pins 25 and 25, the fiber stub 4 is mounted without the misalignment of the optical axis. If the rear surface 32 abuts against the convex portion 17, the light emitting element 23 and the light receiving element 24 are covered to be protected from the exterior, and the most suitable positional relation between the optical fibers 30 and 30 of the short length and the fiber stub 4 is secured.

In the third process, like the fiber stub 4, the optical fiber coupling member 5 is mounted on the fiber stub 4 by inserting the guide pins 25 and 25 into the guide pin holes 35 and 35. In this instance, the optical fiber coupling member 5 is slid, with a coupling surface 36 thereof abutting against the front surface 31 of the fiber stub 4 (the coupling surface 36 opposite to the front surface 31 is drawn by a dotted line, since it is at a position which is hided from an angle viewing the optical fiber coupling member 5 in FIG. 1). Since the optical fiber coupling member 5 is guided by the guide pins 25 and 25, the optical fiber coupling member 5 is mounted without the misalignment of the optical axis. In this way, the mounting of the optical communication module 1 is completed.

According to the optical communication module 1 of the present invention, since the connection between the circuit (not illustrated) of the transceiver circuit 2, and the light emitting element 23 and light receiving element 24 is changed from the connection obtained by bending the lead frame, like the related art, to the connection using the submount unit 3, it is possible to shorten the electrical connection distance (the transmission paths 18, 19, 20 and 21 are short). As a result, the configuration and structure suitable for the high-speed transmission is effectively achieved.

According to the optical communication module 1 of the present invention, since the configuration and the structure do not need the space which is required to form the bent portion of the lead frame, like the related art, the optical communication module 1 can be effectively miniaturized.

According to the optical communication module 1 of the present invention, since it is not necessary for the submount unit 3 to have the flexibility, like the lead frame of the related art, the fixing or positioning of the light emitting element 23 or the light receiving element 24 can be effectively carried out.

According to the optical communication module 1 of the present invention, since the submount unit 3 is formed by using the material having low thermal expansion/shrinkage, it is possible to effectively suppress the misalignment of the optical axis of the optical communication module 1 during temperature change.

Various modifications and alterations can be made without changing the range of the present invention.

Figure 3:
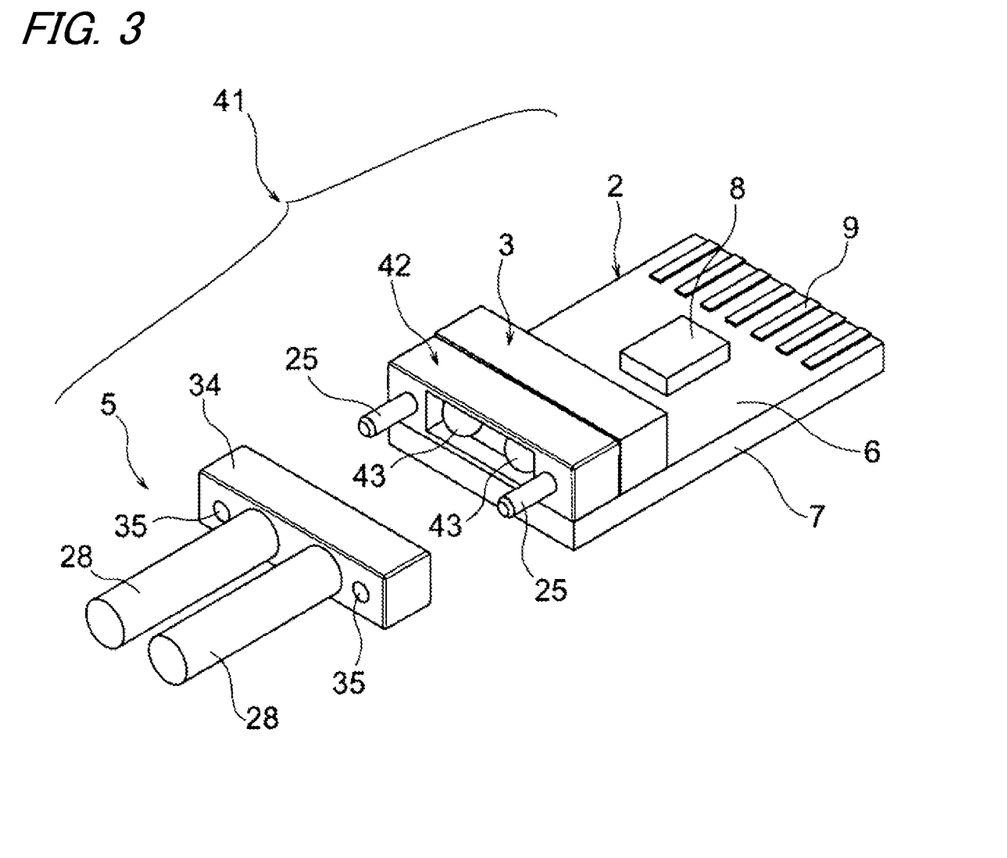
FIG. 3 is a perspective view illustrating a first modification of the optical communication module.
Figure 4:
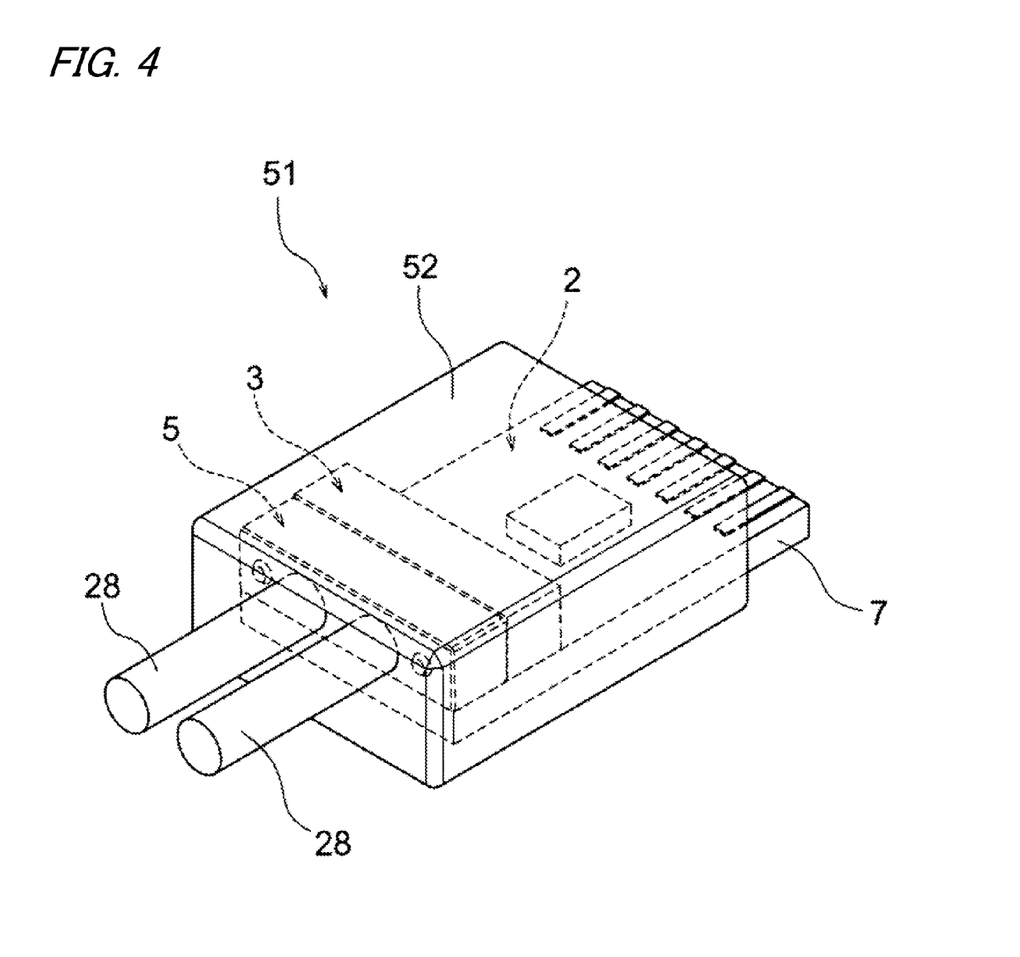
FIG. 4 is a perspective view illustrating a second modification of the optical communication module.
Figure 5:
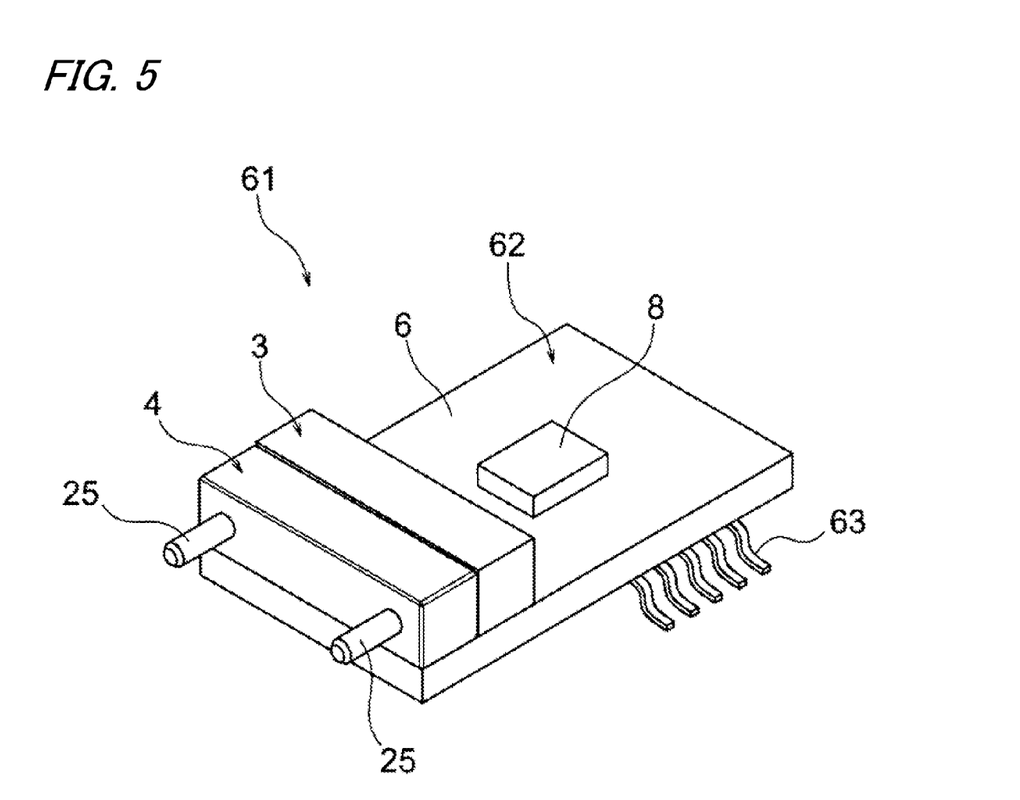
FIG. 5 is a perspective view illustrating a third modification of the optical communication module.
Figure 6:
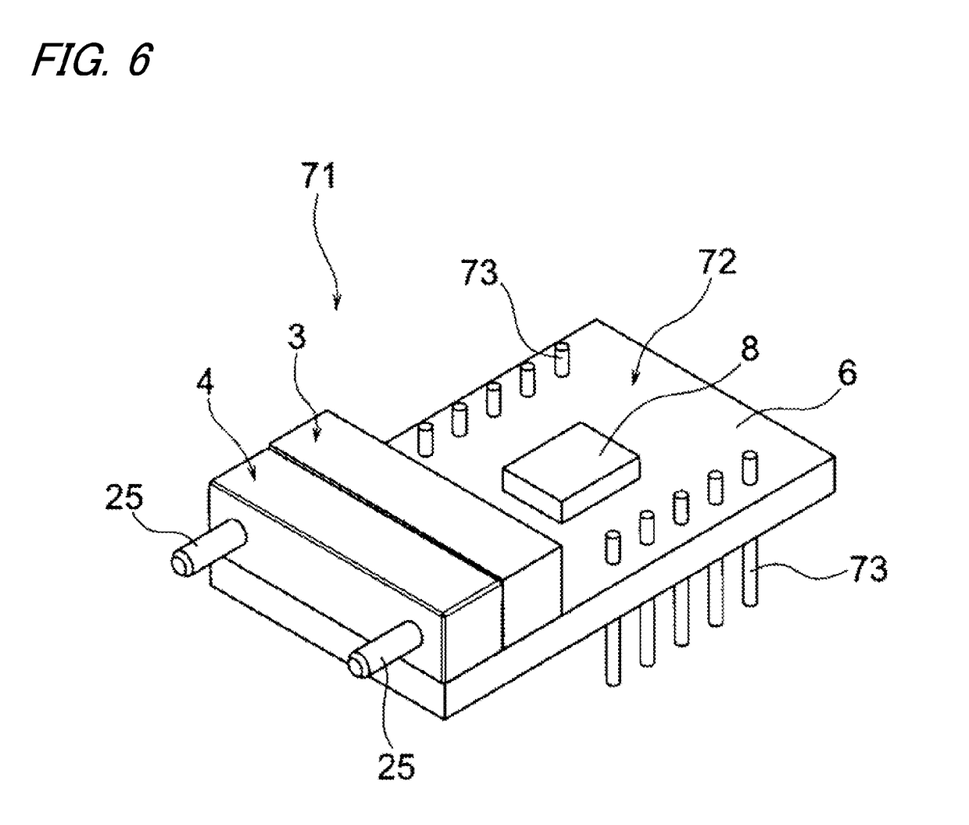
FIG. 6 is a perspective view illustrating a fourth modification of the optical communication module.

Modifications of the optical communication module will now be described with reference to FIGS. 3 to 6. FIG. 3 is a perspective view illustrating a first modification. FIG. 4 is a perspective view illustrating a second modification. FIG. 5 is a perspective view illustrating a third modification. FIG. 6 is a perspective view illustrating a fourth modification.

In FIG. 3, an optical communication module 41 of the first modification is similar to the optical communication module 1 in FIG. 1, except for including a lens module 42 (optical connection member) as an alternative of the fiber stub 4 (see FIGS. 1 and 2). The lens module 42 makes transmitted light in parallel light and enters it an optical fiber 28. Also, the optical communication module 41 includes convex lenses 43 and 43 for concentrating the light received from the optical fiber 28. The lens member 42 is configured to contribute to the improvement of the optical coupling efficiency.

In FIG. 4, an optical communication module 51 of the second modification is similar to the optical communication module 1 in FIG. 1, except for that it is not a detachable structure, but is a pigtail type structure in which the optical fiber coupling member 5 is firmly fixed to the submount unit 3 by a fixing member 52.

In FIG. 5, an optical communication module 61 of the third modification is similar to the optical communication module 1 in FIG. 1, except for a transceiver circuit 62 has a surface mounting connection 62 as an alternative for the substrate body 7 (see FIG. 1) of a card edge connector type.

In FIG. 6, an optical communication module 71 of the fourth modification is similar to the optical communication module 1 in FIG. 1, except for that a transceiver circuit 72 has a through-lead 73 for flow connection as an alternative for the substrate body 7 (see FIG. 1) of the card edge connector type.

A BGA (Ball Grid Array) may be used as the alternative. Also, the transmission side and the receiving side are the integral configuration and structure in the above description, but the present invention is not limited thereto. A module with the light emitting element 23 only mounted thereon, or a module with the light receiving element 24 only mounted thereon may be employed.

It is apparent to those skilled in the art that the present invention has been described with reference to specific embodiments, but the present invention can be properly modified or revised, without deviating from the scope of the invention.

This application claims priority to Japanese Patent Application No. 2010-160211 filed on Jul. 15, 2010, and the entire disclosure thereof is hereby incorporated herein by reference.

INDUSTRIAL APPLICATION

According to the optical communication module of the present invention, the submount unit of the substantially block shape is mounted on the mounting surface of the circuit substrate to form the optical communication module, and the submount unit has the construction to shorten the transmission path extending from the optical element which is mounted on the optical element mounting surface, as compared to the related art. Accordingly, the optical communication module including the configuration and structure suitable for the high-speed transmission can be effectively provided. In addition, according to the optical communication module of the present invention, the submount unit is mounted on the mounting surface of the circuit substrate, without being floated, it does need the space, like the related art. As a result, the compact optical communication module can be provided. In addition, according to the present invention, since the submount unit is formed in the substantially block shape, and the transmission path is provided to extend over the optical element mounting surface and the connection surface of the submount unit of such a shape, it is not necessary for the submount unit to have the flexibility, like the lead frame of the related art. As a result, the fixing or positioning of the optical element can be effectively carried out. Moreover, according to the optical communication module of the present invention, since the submount unit is formed in the substantially block shape, the submount unit is made of the material having low thermal expansion/shrinkage. As a result, it is possible to effectively suppress the misalignment of the optical axis during temperature change.

REFERENCE SIGNS LIST

1: optical communication module
2: transceiver circuit (circuit substrate)
3: submount unit
4: fiber stub (optical connection member)
5: optical fiber coupling member
6: mounting surface
7: substrate body
8: electronic component
9: card edge portion
10: connection surface
11: bottom surface
12: front surface
13: rear surface
14: lateral surface
15: top surface
16: optical element mounting surface
17: convex portion
18 to 21: transmission path
22: surface mounting connection
23: light emitting element (optical element)
24: light receiving element (optical element)
25: guide pin (optical aligning means)
26: lateral end
27: front end
28: optical fiber
29: stub body
30: optical fiber of short length
31: front surface
32: rear surface
33, 35: guide pin hole (optical axis aligning means)
34: coupling component body
36: coupling surface
37: hole
41, 51, 61, 71: optical communication module
42: lens member (optical connection member)
43: convex lens
52: fixing member
62: transceiver circuit
63: surface mounting lead
72: transceiver circuit
73: through-lead for flow connection

The invention claimed is:

1. An optical communication module comprising:
a circuit substrate;
a submount unit having a substantially block shape configured to be mounted on a mounting surface of the circuit substrate;
wherein the submount unit comprises
a connection surface mounted on the mounting surface,
a surface mounting connection which is provided on the connection surface and comes in contact with a substrate-side connection of the mounting surface,
an optical element mounting surface which is a surface in a direction substantially perpendicular to the connection surface,
an optical element which is mounted on the optical element mounting surface, of which an optical axis is in substantially parallel with the mounting surface, and
a transmission path which is wired over the connection surface and the optical element mounting surface to connect the optical element and the surface mounting connection; and
an optical connection member configured to be interposed between the optical element of the optical element mounting surface and an optical fiber corresponding to the optical element,
wherein the optical connection member abuts the submount unit,
wherein a convex portion protrudes from the optical element mounting surface to abut against the optical connection member, and
wherein the convex portion has a portal shape that encloses the optical element mounting surface.

2. The optical communication module according to claim 1, further comprising an optical axis aligning unit for aligning optical axes of the optical element and the optical fiber.

* * * * *